United States Patent [19]

Dreyer et al.

[11] Patent Number: 5,472,911

[45] Date of Patent: Dec. 5, 1995

[54] METHOD FOR CONTROLLING ELECTROMIGRATION AND ELECTRICALLY CONDUCTIVE INTERCONNECT STRUCTURE THEREFOR

[75] Inventors: Michael L. Dreyer; Charles J. Varker, both of Scottsdale; Ganesh Rajagopalan, Tempe, all of Ariz.

[73] Assignee: Motorola, Inc., Schaumburg, Ill.

[21] Appl. No.: 300,818

[22] Filed: Sep. 2, 1994

[51] Int. Cl.⁶ .................................................. H01L 21/441
[52] U.S. Cl. ........................ 437/187; 437/203; 437/957
[58] Field of Search ................................. 437/203, 957, 437/187, 197, 200

[56] References Cited

U.S. PATENT DOCUMENTS

| | | |
|---|---|---|
| 3,848,330 | 11/1974 | Hall et al. . |
| 4,352,239 | 10/1982 | Pierce ........................................ 437/247 |
| 4,630,094 | 12/1986 | Wiley et al. . |
| 4,744,858 | 5/1988 | McDavid et al. ........................ 437/187 |
| 4,942,138 | 7/1990 | Miki ........................................... 437/957 |
| 5,001,541 | 3/1991 | Virkus et al. ............................. 437/957 |
| 5,018,001 | 5/1991 | Kondo et al. ............................. 437/957 |
| 5,063,175 | 11/1991 | Broadbent et al. ...................... 437/192 |
| 5,101,261 | 3/1992 | Maeda ...................................... 437/957 |
| 5,187,561 | 2/1993 | Hasunuma et al. ...................... 257/771 |
| 5,208,187 | 5/1983 | Tsubouchi et al. ...................... 437/245 |
| 5,262,361 | 11/1993 | Cho et al. ................................. 437/203 |
| 5,382,831 | 1/1995 | Atakov ..................................... 257/767 |

FOREIGN PATENT DOCUMENTS

| | | | |
|---|---|---|---|
| 0174740 | 3/1989 | Japan ................................... | 437/203 |
| 4134826 | 5/1992 | Japan ................................... | 437/957 |
| 4207035 | 7/1992 | Japan ................................... | 437/957 |

OTHER PUBLICATIONS

M. L. Dreyer, "An electromigration model that includes the effects of microstructure and temperature on mass transport", Journal of Applied Physics 73(10), May 15, 1993, pp. 4894–4902.

Baerg, William, "Using Metal Grain Size Distributions to Predict Electromigration Performance", Solid State Technology, Mar. 1991, pp. 35–37.

Primary Examiner—Brian E. Hearn
Assistant Examiner—Michael Trinh
Attorney, Agent, or Firm—Bernard Berman; Harry A. Wolin; Rennie William Dover

[57] ABSTRACT

A method and an electrically conductive interconnect structure (30) for controlling electromigration. The electrically conductive interconnect structure (30) comprises a groove (33) adjacent an electrically conductive interconnect (39). The electrically conductive interconnect (39) is patterned from a deposited layer of conductive material which contains global grain microstructures. Moreover, the electrically conductive interconnect (39) is patterned to have polycrystalline and single-grain segment lengths that are less than a length at which an electromigration flux fails to overcome a gradient-driven counter flux in a line segment. The groove (33) controls the polycrystalline and single-grain segment lengths to be less than the critical length, thereby reducing electromigration.

12 Claims, 2 Drawing Sheets

METHOD FOR CONTROLLING ELECTROMIGRATION AND ELECTRICALLY CONDUCTIVE INTERCONNECT STRUCTURE THEREFOR

BACKGROUND OF THE INVENTION

The present invention relates, in general, to electrically conductive interconnects, and more particularly, to controlling electromigration in electrically conductive interconnects.

Semiconductor device manufacturers are constantly striving to reduce device sizes and to increase operational performance thereby increasing the current densities at which these devices operate. During device operation at high current densities, metal atoms migrate from one portion of an electrically conductive interconnect to another portion. As those skilled in the art are aware, migration of metal atoms, commonly referred to as electromigration, decreases the reliability of the semiconductor devices. More particularly, the movement of metal atoms creates voids in one portion of the electrically conductive interconnect and hillocks, i.e., a pileup of metal atoms, in another portion of the electrically conductive interconnect. The voids may result in open circuits, whereas the hillocks may result in one or more electrically conductive interconnects becoming shorted.

Accordingly, it would be advantageous to have a method and a structure for improving semiconductor device reliability by controlling the migration of metal atoms. It would be of further advantage for the method to be compatible with conventional semiconductor processing techniques.

DETAILED DESCRIPTION OF THE DRAWINGS

Figure 1:
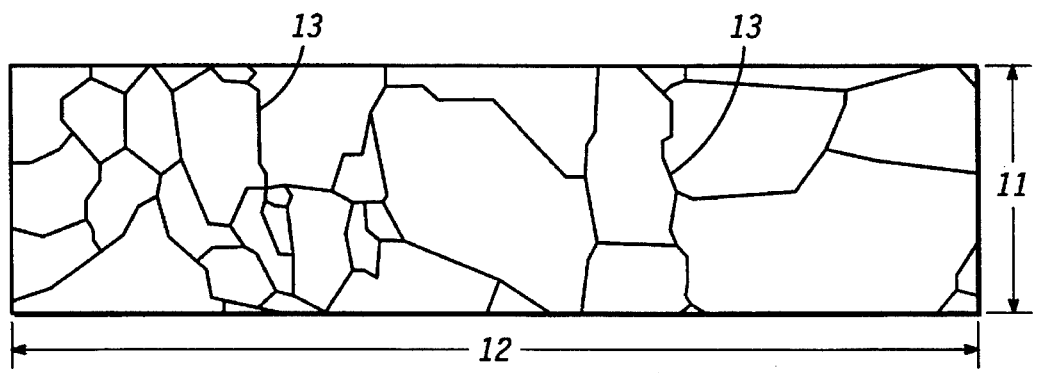
FIG. 1 illustrates an enlarged top view of a surface of a segment of an electrically conductive interconnect having a linewidth greater than a median grain size in accordance with a prior art electromigration model.

The present invention provides an electrically conductive interconnect structure and a method for controlling electromigration in a portion of the electrically conductive interconnect structure. More particularly, the electrically conductive interconnect structure comprises an electrically conductive interconnect and a groove which is adjacent the electrically conductive interconnect. Generally, electrically conductive interconnects are formed by depositing a conductive material on a surface, covering or protecting portions of the deposited conductive material that serves as the conductive interconnects, followed by removing the uncovered or unprotected portions of the deposited conductive material. In other words, the deposited conductive material is patterned to form the interconnects. Typically, the deposited conductive material has a microstructure made up of a plurality of grains bounded by grain boundaries, wherein the sizes of the grains are dependent on the deposition conditions, i.e., deposition rate and temperature, and on the characteristics of the surface on which the conductive material is deposited.

The electrically conductive interconnects may be partitioned into two types of structural elements having segment lengths determined by the grain structure of the structural element. Structural elements comprised of polycrystalline grain structures have segment lengths $L_P$ whereas structural elements comprised of single crystalline grain structures have segment lengths $L_S$. These structural elements result from forming the electrically conductive interconnects to have dimensions that are smaller than the dimensions of the largest grain microstructure of the deposited conductive material, i.e., the largest global grain microstructure. Each electrically conductive interconnect has a bounded geometric shape having a set of dimensions that define a surface area. The width of the electrically conductive interconnect structure and the conductive material grain size distribution parameters $D_{50}$ and $\sigma$ determine the distribution of the segment lengths $L_P$ and $L_S$. The grain size distribution parameter, $D_{50}$, of the conductive material is further discussed with reference to FIG. 1. It should be noted that the two structural elements $L_S$ and $L_P$ are typically serially connected in a random fashion to form the total electrically conductive interconnect length. Electrically conductive interconnects having segment lengths are further described in "An electromigration model that includes the effects of microstructure and temperature on mass transport," by M. L. Dreyer, K. Y. Fu, and C. J. Varker and published in J. Appl. Phys. 73(10), 15 May 1993, which is hereby incorporated herein by reference.

In accordance with the present invention, electromigration is controlled by forming the segments $L_P$ and $L_S$ to be less than or equal to a critical length, $L_C$. The critical length is defined as the length of a particular segment ($L_P$ or $L_S$) below which electromigration leading to failure cannot occur. For very long segment lengths electromigration of atoms occurs freely in the direction of electron current flow, eventually leading to interconnect failure. To further explain the present invention, the end of a segment where electron current enters is defined as the cathode region and the end of the segment where electron current exits is defined as the anode region. Since the cathode region is under a tensile stress, i.e., under tension, and the anode region is under a compressive stress, i.e., under compression, a mechanical stress gradient along the length of the segment is also produced. The magnitudes of these gradients are inversely proportional to the segment length and are a direct result of the electromigrating atoms. Further, these gradients produce a flux of atoms in accordance with Fickian diffusion such that the net atomic flux within the segment is proportional to the difference between the flux of electromigrating atoms and the gradient-driven counter flux. When the length of the segment is equal to or less than a critical length the electromigration flux cannot overcome the counter flux it created (vis-a-vis concentration and mechanical stress gradients). Since electromigration induced failure is inversely proportional to the net flux in a segment it is desirable to maintain all segment lengths at or below this critical length so that electromigration leading to failure can not occur. Typically, the value for critical length ranges between approximately 5 µm and approximately 50 µm. Control of the electromigration process is therefore accomplished by forming grooves adjacent to the edge boundaries of the conductive material forming the conductive interconnects. These grooves are used to control the lengths of the polycrystal and single crystal segments $L_P$ and $L_S$, respectively, such that the distributions of respective segment lengths are less than the critical length, thereby impeding the electromigration process. It should be noted that the combination of the grooves and the conductive interconnects is referred to as an electrically conductive interconnect structure. It should be further noted that grooves are also referred to as cavities or furrows.

FIG. 1 illustrates an enlarged top view of the surface of a segment 10 of an electrically conductive interconnect showing the edge and grain boundaries in accordance with a prior art electromigration model. What is shown in FIG. 1 is segment 10 of the electrically conductive interconnect having a linewidth 11 and a length 12 equal to the polycrystalline segment length ($L_P$). In addition, FIG. 1 illustrates grain boundaries 13 corresponding to the grains of a conductive material from which segment 10 is formed. It should be noted that linewidth 11 of segment 10 is greater than the median grain size, $D_{50}$. It should be understood that the median grain size, $D_{50}$, is a statistical quantity representing a figure of merit for the sizes of metallic or conductor grains and can be derived using any of a number of measurement methodologies known to those skilled in the art.

Figure 2:
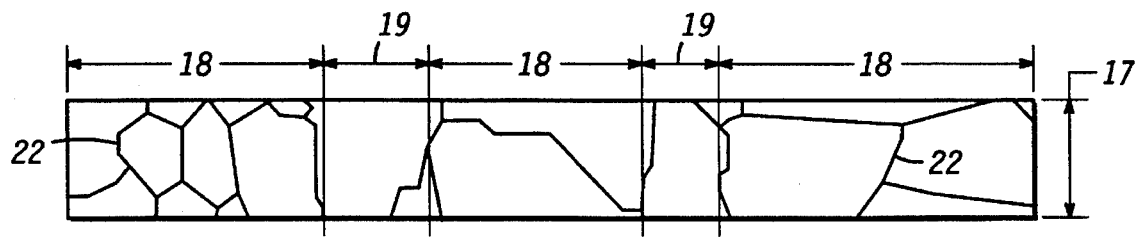
FIG. 2 illustrates an enlarged top view of a surface of a segment of an electrically conductive interconnect having a linewidth equal to the median grain size in accordance with a prior art electromigration model.

FIG. 2 illustrates an enlarged top view of the surface of a segment 14 of an electrically conductive interconnect in accordance with the prior art electromigration model. What is shown in FIG. 2 is a segment 14 of the electrically conductive interconnect having a linewidth 17 and a length equal to the sum of three polycrystalline segment lengths, $L_P$, and two single-grain segments $L_S$. The polycrystalline segments, $L_P$, are indicated by reference numeral 18, whereas the single-grain segments, $L_S$, are indicated by reference numeral 19. In addition, FIG. 2 illustrates the grain boundaries 22 of the conductive material. It should be noted that linewidth 17 of segment 14 is equal to the median grain size, $D_{50}$.

Figure 3:
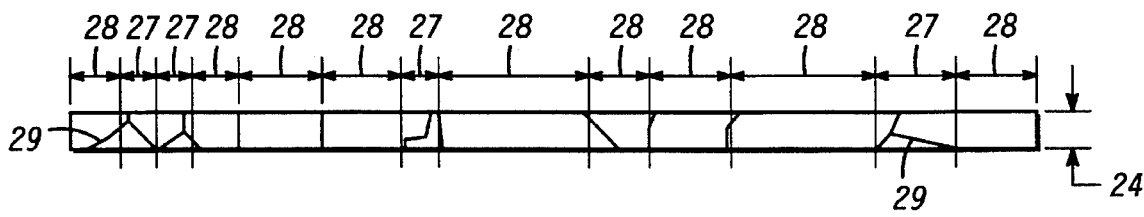
FIG. 3 illustrates an enlarged top view of a surface of a segment of an electrically conductive interconnect having a linewidth less than the median grain size in accordance with a prior art electromigration model.

FIG. 3 illustrates an enlarged top view of the surface of segment 23 of an electrically conductive interconnect in accordance with the prior art electromigration model. What is shown in FIG. 3 is a segment 23 of the electrically conductive interconnect having a linewidth 24 and a length equal to the sum of four polycrystalline segment lengths, $L_P$, and nine single-grain segment lengths, $L_S$. The polycrystalline segments, $L_P$, are indicated by reference numerals 27, whereas the single-grain segments, $L_S$, are indicated by reference numerals 28. In addition, FIG. 3 illustrates grain boundaries 29 of the conductive material. It should be noted that linewidth 24 of segment 23 is less than the median grain size $D_{50}$. It should be understood that models of an electrically conductive interconnect having polycrystalline and single-grain segment lengths $L_P$ and $L_S$, respectively, are well known to those skilled in the art. Further, a description of these segments may be found in "An electromigration model that includes the effects of microstructure and temperature on mass transport," which has been incorporated by reference.

In accordance with the present invention, it has been discovered that the electromigration rate is dependent on the current density in the polycrystalline and single-grain segment lengths, $L_P$ and $L_S$, respectively. Further, when the polycrystalline and single-grain segment lengths, $L_P$ and $L_S$, respectively, are reduced to the critical length, $L_C$, electromigration is reduced. Thus, electromigration may be reduced in an electrically conductive interconnect by setting the polycrystalline and single-grain segment lengths, $L_P$ and $L_S$, respectfully, to a value less than or equal to the critical length $L_C$.

Figure 4:
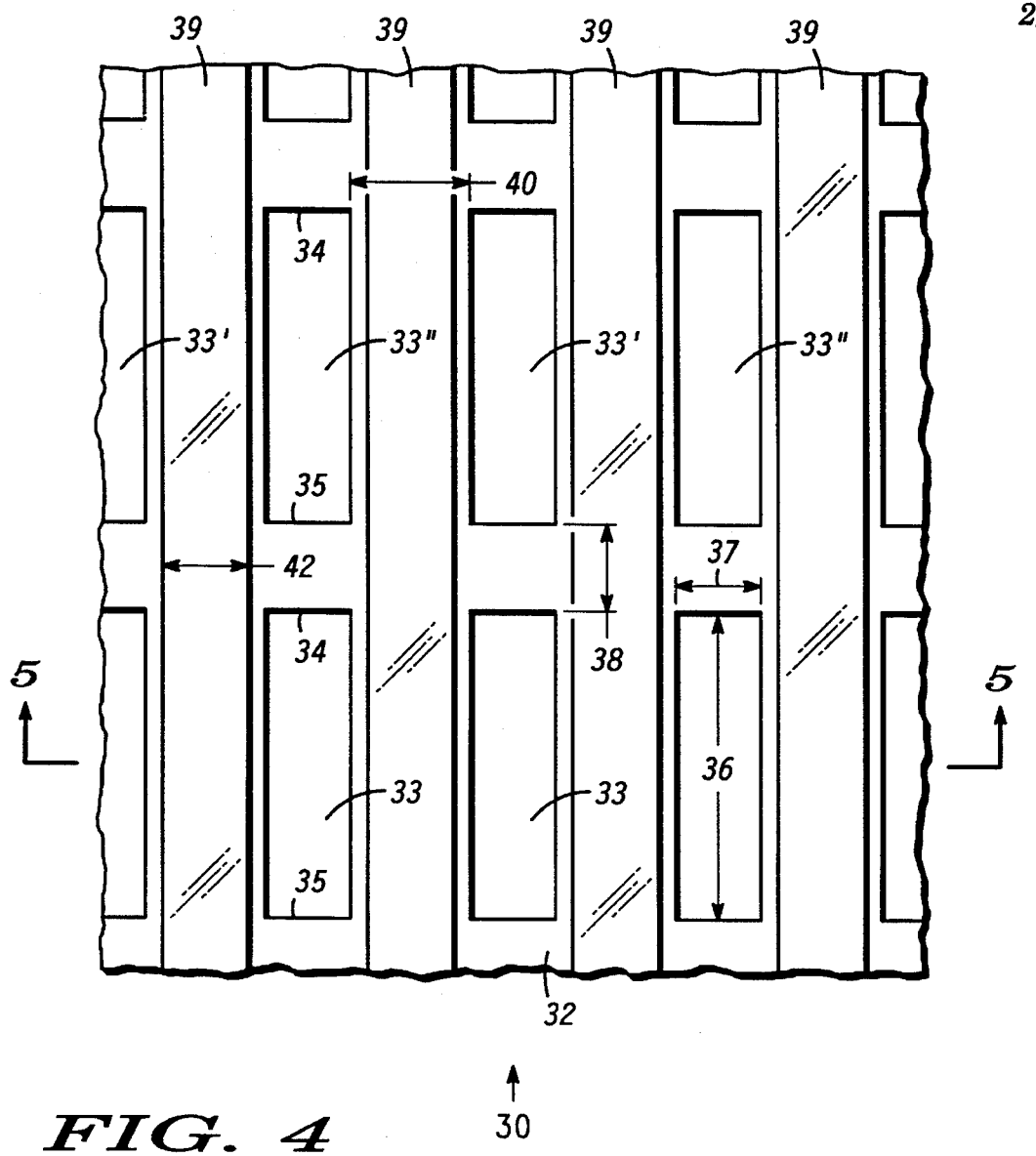
FIG. 4 illustrates a large area top view of an electrically conductive interconnect structure in accordance with an embodiment of the present invention.

FIG. 4 illustrates a top view of the surface of an electrically conductive interconnect structure 30 in accordance with an embodiment of the present invention. What is shown in FIG. 4 is a substrate 32 having electrically conductive interconnects 39 disposed thereon. In accordance with the embodiment shown in FIG. 4, substrate 32 is a layer of dielectric material patterned to have a plurality of grooves or furrows 33 formed therein. Grooves 33 are formed in the uncovered or exposed portions of layer of dielectric material 32 using etching techniques such as, for example, reactive ion etching or wet chemical etching. Each groove 33 is a rectangular shaped structure having first and second ends 34 and 35, respectively, a length 36, and a width 37. By way of example, grooves 33 have a length of at least 0.6 microns, and preferably length 36 of grooves 33 ranges from approximately 0.6 microns (µm) to approximately 1,000 µm, width 37 of grooves 33 ranges from approximately 0.6 µm to approximately 2 µm, and a distance 38 between a first end 34 of one groove 33 and second end 35 of an adjacent groove 33 may range from approximately 1.2 µm to approximately 2000 µm. In addition, grooves 33 have a depth 41 of at least 0.05 microns and preferably depth 41 of grooves 33 ranges from approximately 0.05 µm to approximately 3 µm.

Figure 5:
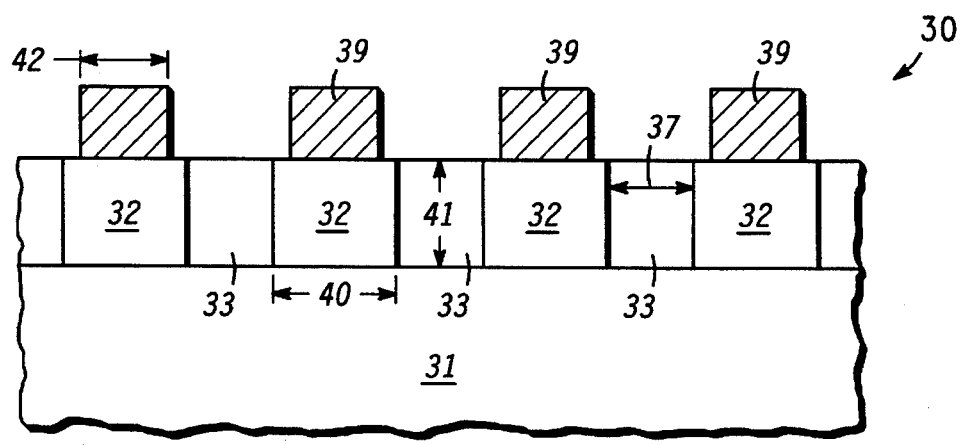
FIG. 5 illustrates a highly enlarged cross-sectional view of the electrically conductive interconnect structure of FIG. 4 along section line 5—5.

Preferably, grooves 33 are formed in sets of two, i.e., pairs, wherein one groove 33' of the set is parallel to and separated from another groove 33" of the set by a sufficient distance to allow formation of the electrically conductive interconnect (reference numeral 39 of FIGS. 4 and 5). In other words, electrically conductive interconnects 39 are preferably formed between grooves 33' and 33" of each set of grooves. First end 34 of one groove 33 is separated from second end 35 of an adjacent groove 33 by a distance indicated by arrows 38. Techniques for forming grooves in a layer of dielectric material are well known in the art. For example, a layer of dielectric material 32 may be covered with a layer of photoresist (not shown) which is subsequently patterned to uncover portions of layer of dielectric material 32 in which grooves 33 are to be formed. Thus, the portions of layer of dielectric material in which grooves 33 are to be formed become exposed. It should be understood that the number and shape of grooves 33 are not limitations of the present invention. It should be further understood that the dimensions of grooves 33 and the spacing between grooves 33 are also not limitations of the present invention. For example, the linewidths of adjacent grooves may be different from one another.

Preferably grooves 33 are separated by a distance indicated by arrows 40, wherein the distance is selected to permit formation of an electrical interconnect 39 having a linewidth 42 such that the single crystalline and polycrystalline segments, $L_S$ and $L_P$, respectfully, are less than the critical length, $L_C$. It should be noted that reliability of electrically conductive interconnects is enhanced if the electrically conductive interconnects are sized to have a bamboo structure, i.e., a structure in which the median grain size is significantly larger than linewidth 42. The bamboo structure for electrically conductive interconnects having linewidths less than $D_{50}$ is structurally different than that for electrically conductive interconnects having linewidths greater than $D_{50}$. As those skilled in the art are aware, bamboo structures typically comprise single conductor grains which are serially connected to each other. In addition, the single conductor grains are separated by grain boundaries oriented along the linewidth dimension which extends directly through the electrically conductive interconnects to the supporting substrate, thereby forming single crystalline or single grain segments. By contrast, polycrystalline segments have a large number of grain boundaries oriented in the direction of electron current flow. As those skilled in the art will recognize, electromigration is a diffusion phenomenon in which material transport occurs preferentially in the direction of electron current flow. Further, material flow for electrically conductive interconnects that are significantly wider than the median grain size is dominated by grain boundary diffusion which exhibits shorter lifetimes because a large number of boundaries are oriented along the direction of electron current flow. Thus, grooves 33 are spaced apart by a distance indicated by arrows 40 such that linewidths 42 are less than $D_{50}$, thereby decreasing electromigration.

A layer of conductive material (not shown) is formed on layer of dielectric material 32, wherein the layer of conductive material fills grooves 33. Suitable materials for the layer of conductive material include metal films, semiconductor films, metal oxide films, and the like. The layer of conductive material is patterned to form electrically conductive interconnects 39. More particularly, the portions of the layer of conductive material filling grooves 33 is removed, thereby leaving grooves 33 unfilled. Techniques for forming and pattering the layer of conductive material are well known to those skilled in the art.

FIG. 5 illustrates a cross-sectional view of the electrically conductive interconnect structure 30 of FIG. 4 along section line 5—5. More particularly, FIG. 5 illustrates substrate 31 having the patterned layer of dielectric material 32 disposed thereon. It should be understood that support material 31 and layer of dielectric material 32 are collectively referred to as a substrate. It should be further understood that the material of support material 31 and layer of dielectric material 32 are not limitations of the present invention. For example, support material 31 may be a semiconductor material such as silicon and layer of dielectric material 32 may be oxide. Likewise, support material 31 may be a dielectric material such as oxide or nitride and layer of dielectric material 32 may also be oxide or nitride. In addition, FIG. 5 illustrates grooves 33 formed in patterned layer of dielectric material 32. Cavities 33 have a width 37 and a depth 41. Electrically conductive interconnects 39 are formed on the portions of patterned layer of dielectric material 32 between grooves 33. Forming grooves on both sides of a conductive interconnect increases the probability of forming a bamboo single crystalline segment. This type of segment structure limits the material flow by diffusion processes in the direction of electron current flow along grain boundaries and confines the material flow to inter-grain (lattice) diffusion which is significantly slower than grain boundary diffusion, thereby reducing electromigration transport and increasing reliability.

By now it should be appreciated that a method for controlling or setting the electromigration in an electrically conductive interconnect has been provided. In addition, an electrically conductive interconnect structure has been provided. The present invention reduces electromigration transport and increases reliability of electrically conductive interconnects. Further, the method and structure of the present invention may be readily incorporated into integrated devices, thereby improving the reliability of electrically conductive interconnects. This improvement in reliability permits operation of integrated devices at higher temperatures and higher power levels.

We claim:

1. A method for controlling electromigration in an electrically conductive interconnect, having a bamboo structure comprising the steps of:

providing a substrate having a major surface;

forming at least one groove in a portion of the substrate, the at least one groove extending from the major surface into the substrate; and forming the electrically conductive interconnect on a potion of the major surface adjacent the at least one groove, wherein the at least one groove serves to control electromigration by controlling polycrystal and single crystal segment lengths within a microstructure of the electrically conductive interconnect.

2. The method of claim 1, wherein the step of forming a groove includes forming the groove having a depth of at least 0.05 microns.

3. The method of claim 1, wherein the step of forming a groove includes forming the groove having a length of at least 0.6 microns.

4. The method of claim 1, wherein the step of forming a groove includes etching the substrate.

5. The method of claim 4, wherein the step of forming a groove includes using reactive ion etching to form the groove.

6. The method of claim 1, wherein the step of forming the electrically conductive interconnect includes using a metal for a material of the electrically conductive interconnect.

7. The method of claim 1, wherein the step of providing a substrate includes providing the substrate comprising a semiconductor material having a layer of dielectric material disposed thereon.

8. The method of claim 1, wherein the step of forming a groove includes forming at least two grooves and the step of forming the electrically conductive interconnect includes forming the electrically conductive interconnect between the at least two grooves.

9. A method for controlling electromigration in an electrically conductive interconnect, having a bamboo structure, comprising the steps of:

providing a substrate having a major surface;

forming a first set of grooves in a portion of the substrate, the first set of grooves extending from the major surface into the substrate, wherein each groove of the first set of grooves further comprises a first end and a second end, and wherein the first end of one groove of the first set of grooves is spaced apart from the second end of another groove of the first set of grooves by at least 0.6 microns;

forming a second set of grooves in a portion of the substrate, the second set of grooves extending from the major surface into the substrate, wherein each groove of the second set of grooves further comprises a first end and a second end, and wherein the first end of one groove of the second set of grooves is spaced apart from the second end of another groove of the second set of grooves by at least 0.6 microns; and forming the electrically conductive interconnect between the first and second sets of grooves wherein the first set of grooves and the second set of grooves serve to control electromigration by controlling polycrystal and single crystal segment lengths within a microstructure of the electrically conductive interconnect.

10. The method of claim 9 wherein the first set of grooves is parallel to the second set of grooves, the grooves of the first set of grooves have the same dimensions as the grooves of the second set of grooves, and at least one groove of the first set of grooves is opposite at least one groove of the second set of grooves.

11. A method for controlling grain structure of a conductive interconnect to reduce electromigration in the conductive interconnect, comprising the steps of:

provided a substrate having a major surface;

patterning a portion of the major surface, wherein the step of patterning comprises forming at least one furrow extending into the major surface:

forming a layer of conductive material on the major surface, wherein the layer of conductive material covers a portion of the patterned portion of the major surface; and removing a portion of the layer of conductive material from the substrate to form the conductive interconnect on the patterned portion of the major surface, wherein the patterned portion of the major surface controls the grain structure of the conductive interconnect having a bamboo structure.

12. The method of claim 4, wherein the step of removing a portion of the layer of conductive material from the substrate includes removing the layer of conductive material from the at least one furrow extending into the major surface.

* * * * *